(12) United States Patent
Liu et al.

(10) Patent No.: US 9,825,141 B2
(45) Date of Patent: Nov. 21, 2017

(54) THREE DIMENSIONAL MONOLITHIC LDMOS TRANSISTOR

(71) Applicant: Avago Technologies General IP (Singapore) Pte. Ltd., Singapore (SG)

(72) Inventors: Qing Liu, Watervliet, NY (US); Shom Ponoth, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/755,625

(22) Filed: Jun. 30, 2015

(65) Prior Publication Data

US 2016/0351710 A1 Dec. 1, 2016

Related U.S. Application Data

(60) Provisional application No. 62/166,329, filed on May 26, 2015, provisional application No. 62/171,626, filed on Jun. 5, 2015.

(51) Int. Cl.

| | |
|---|---|
| *H01L 27/13* | (2006.01) |
| *H01L 29/417* | (2006.01) |
| *H01L 49/02* | (2006.01) |
| *H01L 27/06* | (2006.01) |
| *H01L 27/12* | (2006.01) |
| *H01L 29/786* | (2006.01) |

(Continued)

(52) U.S. Cl.
CPC .. *H01L 29/41783* (2013.01); *H01L 21/76895* (2013.01); *H01L 23/485* (2013.01); *H01L 27/0629* (2013.01); *H01L 27/1203* (2013.01); *H01L 27/13* (2013.01); *H01L 28/20* (2013.01); *H01L 29/78624* (2013.01)

(58) Field of Classification Search
CPC . H01L 27/13; H01L 27/0738; H01L 27/0802; H01L 28/20

See application file for complete search history.

(56) References Cited

U.S. PATENT DOCUMENTS

| | | | | |
|---|---|---|---|---|
| 5,108,945 A | * | 4/1992 | Matthews | ......... H01L 21/28211 |
| | | | | 148/DIG. 136 |
| 5,838,044 A | * | 11/1998 | Chang | ................. H01L 27/1112 |
| | | | | 257/369 |

(Continued)

OTHER PUBLICATIONS

Theeuwen, S.J.C.H., et al., LDMOS Technology for RF Power Amplifiers, IEEE Transactions on Microwave Theory and Techniques, vol. 60, No. 6, Jun. 2012, pp. 1755-1763, New York, New York.

(Continued)

*Primary Examiner* — Benjamin Sandvik
(74) *Attorney, Agent, or Firm* — Foley & Lardner LLP

(57) ABSTRACT

A three dimensional monolithic LDMOS transistor implements a drain structure vertically disposed above a level of the structure that includes a drain connection of the transistor. Displacing the drain structure vertically, out of the plane or level of the gate and source/drain connections, creates a three dimensional structure for the transistor. One result is that the transistor consumes far less lateral area on the substrate. The reduction in lateral area in turn provides benefits such as allowing transistors to be more densely arranged on the substrate and allowing additional devices of other types to be formed on the substrate.

20 Claims, 11 Drawing Sheets

(51) Int. Cl.
*H01L 21/768* (2006.01)
*H01L 23/485* (2006.01)

(56) References Cited

U.S. PATENT DOCUMENTS

| | | | | |
|---|---|---|---|---|
| 6,359,339 | B1* | 3/2002 | Gregor | H01L 28/24 257/384 |
| 6,424,005 | B1 | 7/2002 | Tsai et al. | |
| 6,717,233 | B1* | 4/2004 | Haddad | H01L 21/8221 257/379 |
| 8,284,017 | B2* | 10/2012 | Hakey | G06F 17/5045 257/327 |
| 8,558,654 | B2* | 10/2013 | Le Neel | H01C 17/0656 338/22 R |
| 2002/0020879 | A1* | 2/2002 | Shiiki | H01L 27/0802 257/359 |
| 2005/0062045 | A1* | 3/2005 | Bhattacharyya | H01L 21/84 257/66 |
| 2005/0095763 | A1* | 5/2005 | Samavedam | H01L 21/28079 438/197 |
| 2006/0027894 | A1* | 2/2006 | Harada | H01L 28/20 257/538 |
| 2011/0175174 | A1* | 7/2011 | Stahrenberg | H01L 28/20 257/379 |
| 2012/0228719 | A1* | 9/2012 | Harada | H01L 27/0629 257/381 |
| 2014/0099773 | A1* | 4/2014 | Doris | H01L 21/76897 438/430 |

OTHER PUBLICATIONS

Or-Bach, Zvi, Qualcomm to Leverage Monolithic 3D for Smartphones, Apr. 17, 2015, http://www.eetimes.com/author.asp?section_id=36&doc_id=1326383.

Or-Bach, Zvi, Qualcomm Calls for Monolithic 3D IC, Jun. 17, 2014, http://www.eetimes.com/author.asp?section_id=36&doc_id=1322783.

Courtland, Rachel, The Rise of the Monolithic 3-D Chip, Feb. 24, 2014, http://spectrum.ieee.org/semiconductors/design/the-rise-of-the-monolithic-3d-chip.

* cited by examiner

THREE DIMENSIONAL MONOLITHIC LDMOS TRANSISTOR

PRIORITY CLAIM

This application claims priority to provisional application Ser. No. 62/171,626, filed Jun. 5, 2015, and to provisional application Ser. No. 62/166,329, filed May 26, 2015, which are entirely incorporated by reference.

TECHNICAL FIELD

This disclosure relates to transistors. This disclosure also relates to structures and fabrication techniques for laterally diffused metal oxide semiconductor transistors.

BACKGROUND

Rapid advances in electronics and communication technologies, driven by immense customer demand, have resulted in the widespread adoption of electronic devices of every kind. The transistor is a fundamental circuit component of these devices. Transistors have a wide range of circuit applications, and LDMOS transistors for instance provide a key building block for radio frequency power amplifiers. Improvements in transistor design will improve the implementation and performance of many different types of circuits that rely on LDMOS transistors.

DETAILED DESCRIPTION

A three dimensional monolithic LDMOS transistor provides a drain structure vertically disposed above the gate and channel of the transistor. Displacing the drain structure vertically, out of the plane of the gate and channel creates a three dimensional structure for the transistor. One result is that the transistor consumes far less lateral area on the substrate. The reduction in lateral area in turn provides benefits such as allowing transistors to be more densely arranged on the substrate and allowing additional devices of other types to be formed on the substrate.

Figure 1:
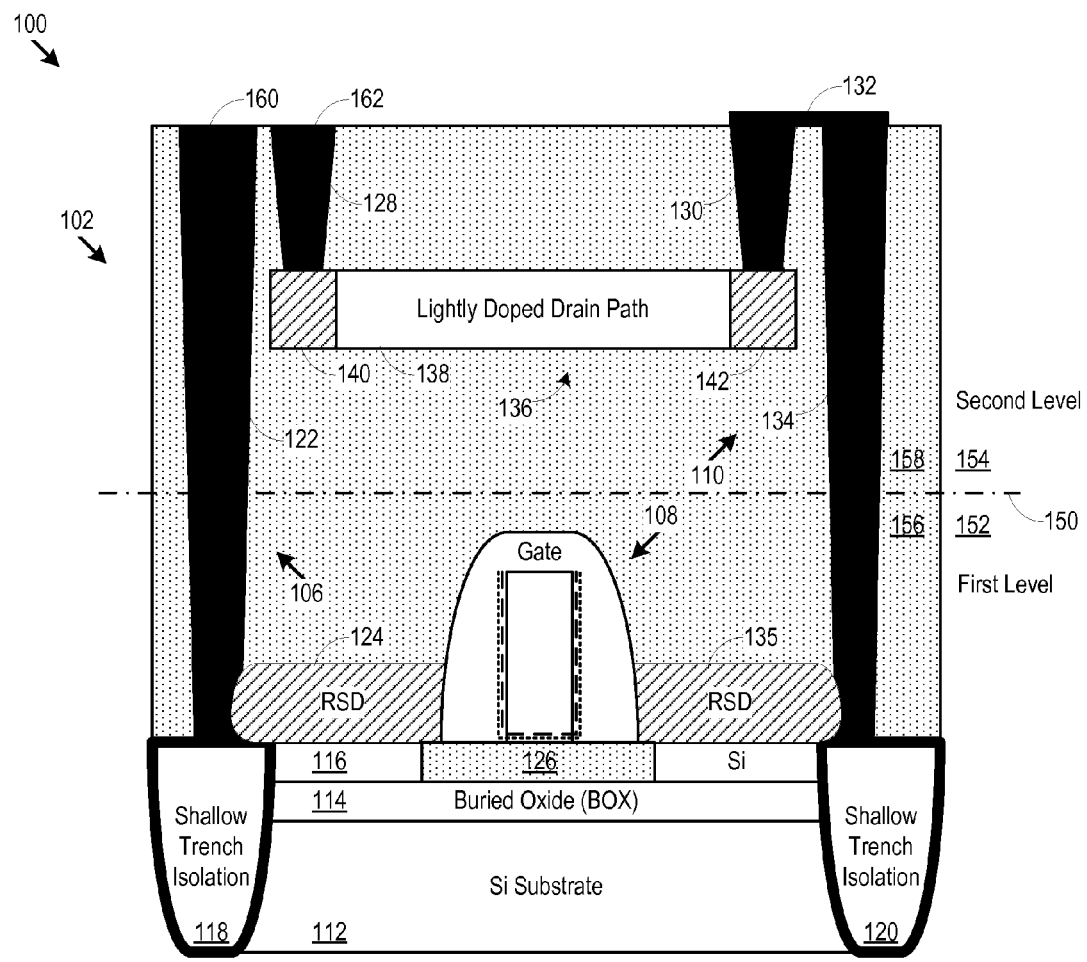
FIG. 1 shows an example of a three dimensional monolithic LDMOS transistor, shown in a cross sectional view and a top down view.
Figure 1:
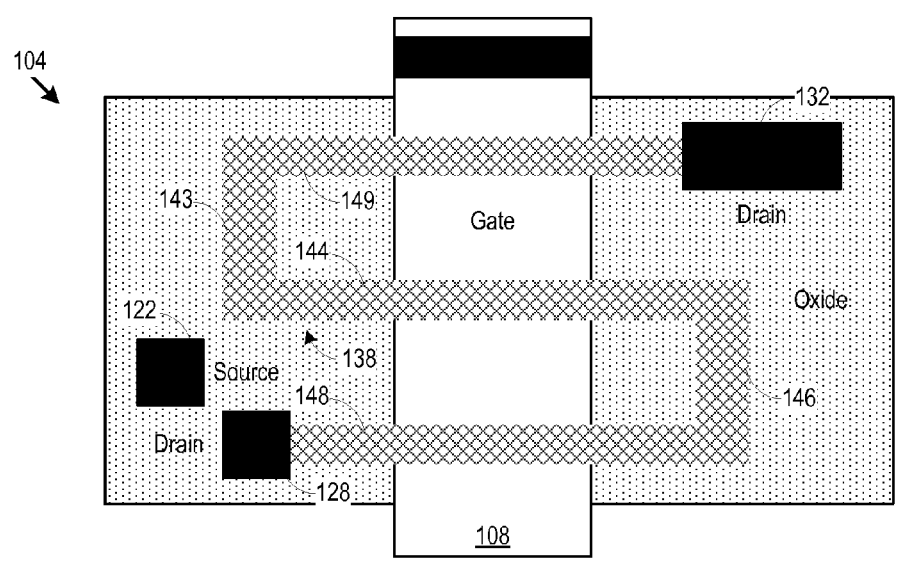

FIG. 1 shows an example of a three dimensional monolithic LDMOS transistor 100, shown in a cross sectional view 102 and a top down view 104. The transistor 100 includes a source structure 106, a gate structure 108, and a drain structure 110. The transistor 100 is fabricated, in this example, with a fully depleted silicon on insulator (FDSOI) planar processing technology. The FDSOI technology includes a silicon substrate 112, buried oxide (BOX) insulating layer 114, and a thin silicon layer 116 for the active devices. Shallow trench isolation 118 and 118 may separate the transistor 100 from neighboring devices (e.g., additional transistors) formed on the same substrate.

The source structure 106 includes the metallization connection 122 and the raised source/drain (RSD) structure 124. The metallization connection 122 may provide a source terminal 160 or other source signal connection for the transistor 100. The gate structure 108 may be a FDSOI gate, a bulk device gate, a FinFET gate, or any other type of transistor gate structure that creates a channel 126 between the source structure 106 and the drain structure 110.

As one of many different implementation options, the drain structure shown in FIG. 1 includes the metallization connections 128, 130, 132, and 134, the RSD structure 135, and a voltage attenuation structure 136. The metallization connection 128 may provide a drain terminal or other drain signal connection for the transistor 100 at one end of the voltage attenuation structure 136. In this example, the voltage attenuation structure 136 is a lightly doped drain path 138 ("path 138"). At each end of the lightly doped drain path 138 are highly doped regions 140 and 142, which may, for instance, reduce contact resistance and voltage drop at the interface between the metallization 128, 130 and the voltage attenuation structure 136.

The structures of the transistor 100 are formed at different levels. FIG. 1 shows a reference line 150 to help illustrate the vertically disposed nature of the structures. In particular, the first level 152 includes a source connection (e.g., the RSD 124), a drain connection (e.g., the RSD 135), and the gate structure 108. The second level 154 includes a drain structure (e.g., the voltage attenuation structure 136) vertically disposed above the first level 152 and connected down to the first level 152, e.g., to the RSD 135. In some implementations, the vertical distance between the top of the first level 152 and the bottom of the voltage attenuation structure 136 is between 30 nm and 100 nm, e.g., 50 nm. However, many different vertical displacements are possible. The first level 152 may be fabricated using a CMOS fabrication process, and the second level 154 may be fabricated with a lower temperature process, e.g., with temperatures below 600 degrees F. That is, the transistor may be fabricated in two layers, each created with a separate fabrication process.

The first level 152 includes insulating material 156 around the transistor structures, and the second level 154 includes insulating material 158 around its transistor structures as well. The insulating material may be SiO2 added with a deposition process. As will be explained in further detail below, the multiple level structure for the transistor 100 may result by bonding an additional semiconductor layer on top of the layer in which the RSD 124, RSD 135, and gate structure 108 are formed, e.g., on top of the SiO2 boundary of the first level 152.

The top view 104 shows the source, gate, and drain connections. The top view also shows one of many different possibilities for the path 138. In this example, a mask and doping sequence defined the path 138 to include conductive segments that form a piece-wise linear path in an 'S' shape. The pieces of the path 138 include the conductive segments 143, 144, 146, 148, and 149.

The conductive segments are resistive, as determined by their doping profile, length, width, and other characteristics. Although the underlying FDSOI process may specify operational voltages of, e.g., 1.5 V to 1.8 V for transistor structures, the conductive segments act as a voltage attenuating structure permitting higher voltage operation. The characteristics of the conductive segments may be controlled to facilitate operational voltages across a wide range for the transistor 100, e.g., 1.5V to 20V or more. As a few specific examples, the transistor 100 may operate at 3.3V, 5V, 7V, 12V, 15V, or 20V, depending on the characteristics chosen for the voltage attenuation structure 136. The voltage attenuation structure 136 drops the full operating voltage down to a level compatible with the underlying FDSOI process for the remainder of the transistor 100, e.g., at the RSD structure 135 and across the gate 108 and channel 126 to the source structure 106.

Note that the transistor 100 is a three dimensional structure in the sense that a portion of the drain structure 110 is vertically displaced. In the particular example of FIG. 1, the voltage attenuation structure 136 is vertically positioned above the gate 108 of the transistor 100. Displacing the drain structure vertically, out of the plane of the remainder of the transistor structures imparts a three dimensional structure to the transistor 100. As mentioned above, one result is that the transistor 100 consumes far less lateral area on the substrate 112, and that in turn allows transistors to be more densely arranged on the substrate 112, and allows additional devices of other types to be formed on the substrate 112 adjacent the transistor 100.

Figure 2:
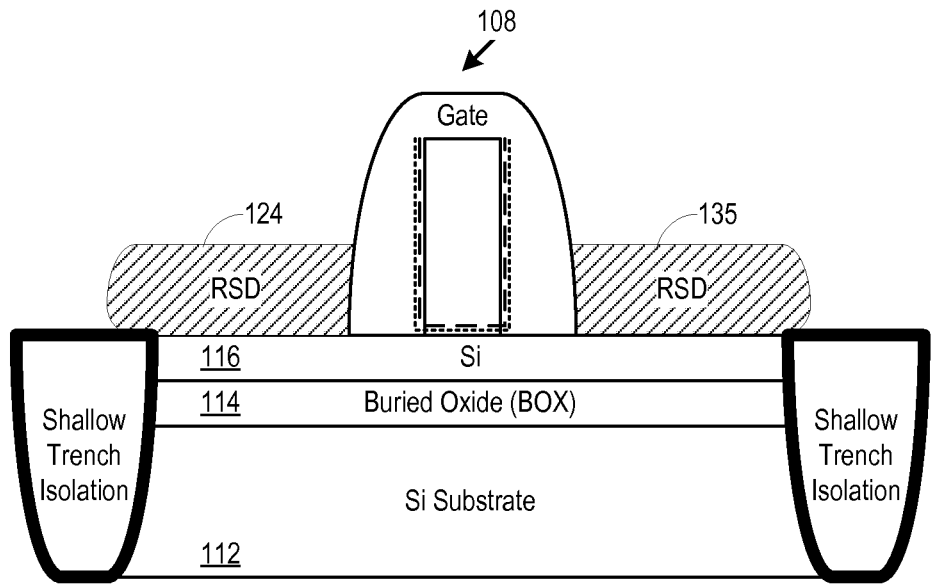
FIGS. 2-7 show examples of fabrication steps for a three dimensional monolithic LDMOS transistor.

FIGS. 2-7 show an example fabrication process for a three dimensional monolithic LDMOS transistor. FIG. 2 shows that the process includes fabrication of the raised source and drain structures 124 and 135 and the gate structure 108. These structures are supported on a silicon on insulator (SOI) structure, including the silicon substrate 112, the insulator layer 114, and the thin silicon layer 116.

Figure 3:
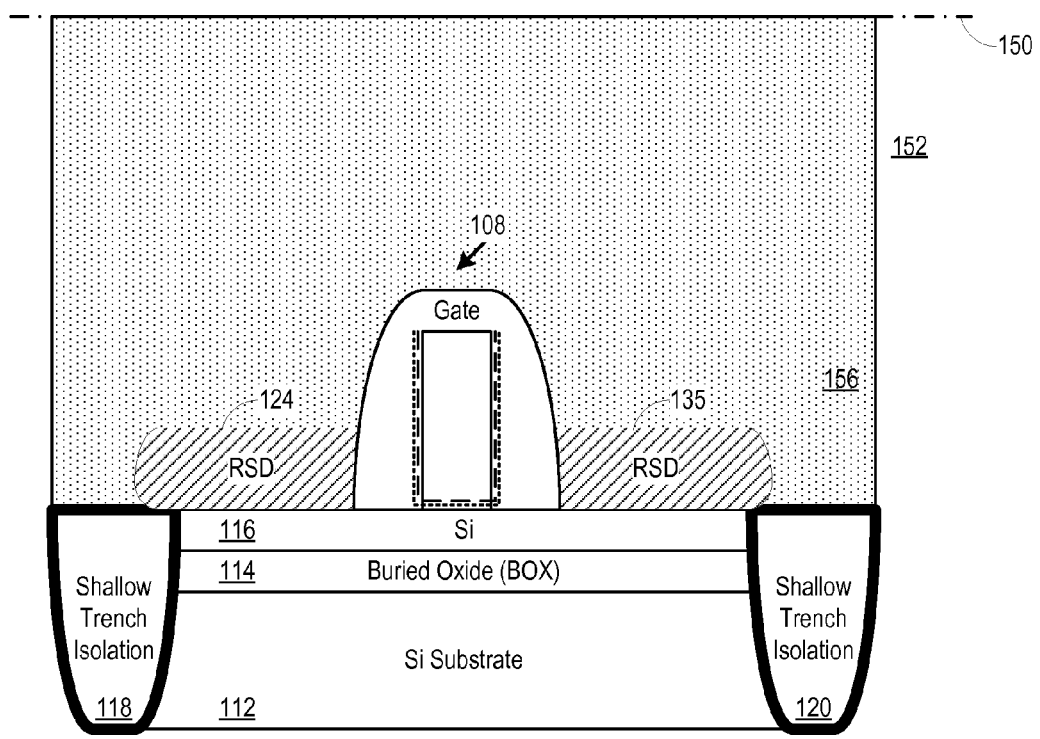

FIG. 3 shows that the process includes depositing insulating material 156 around the structures 108, 124, and 135. After deposition, the process may perform chemical and mechanical planarization. The planarization provides an insulating boundary shown running along the reference line 150.

Figure 4:
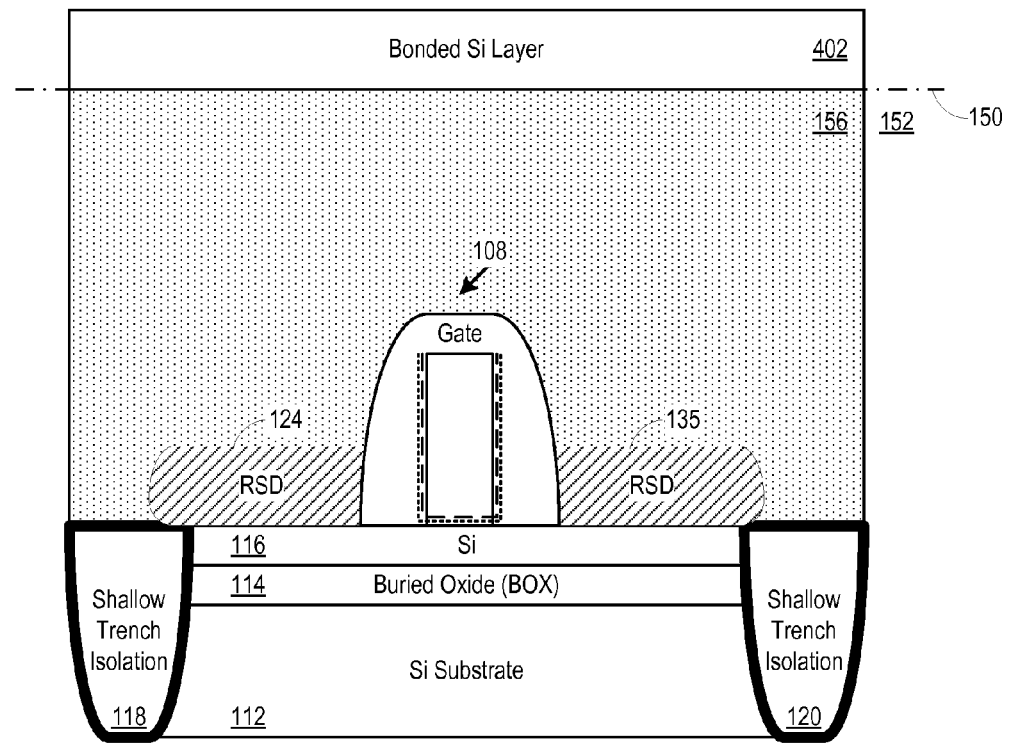

FIG. 4 shows that the process includes bonding a semiconductor layer 402 to the first level 152. The semiconductor layer 402 may be, e.g., a single crystal silicon layer bonded to the insulating material 156. The bonding may be a molecular bonding done at relatively low temperature, e.g., an oxide to oxide, SiO2 to SiO2 bonding.

Figure 5:
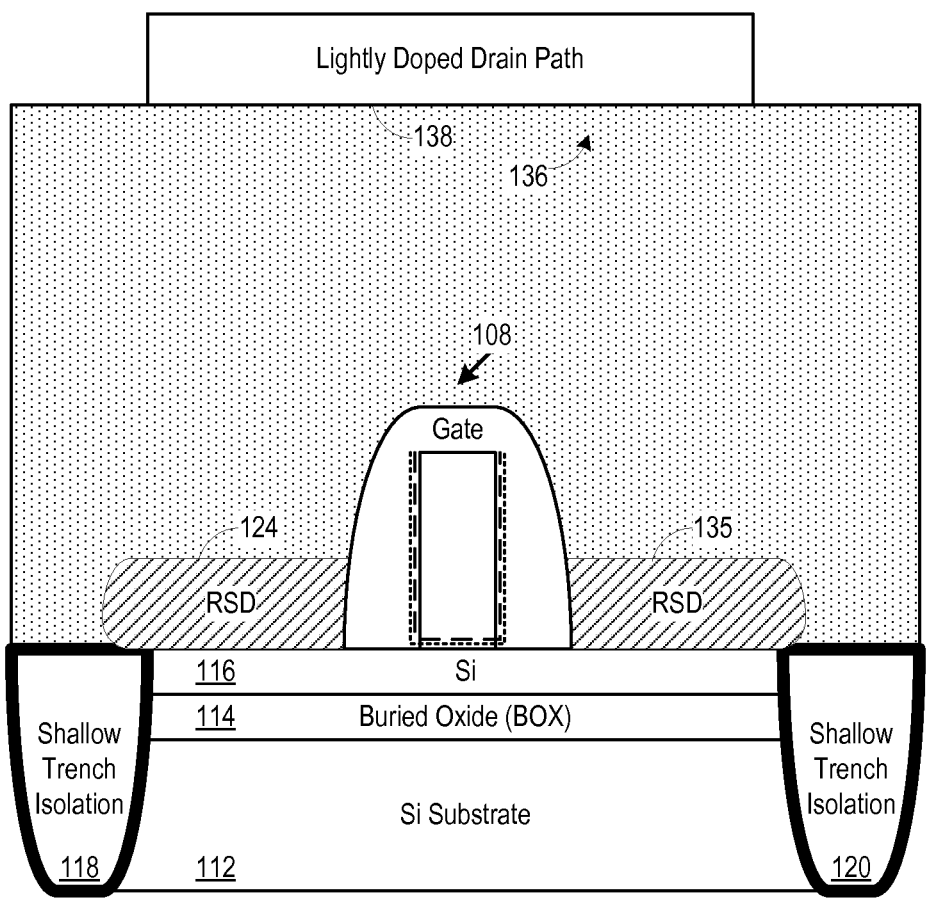

FIG. 5 shows that the process includes creating a voltage attenuation structure 136, e.g., by using a fabrication sequence that includes masking and implantation. In this example, the voltage attenuation structure is a lightly doped drain path. The doping level may be approximately 10^16 to 10^18 atoms per cm^3. The voltage attenuation structure acts as a resistance which provides a pre-determined voltage drop along the structure. The characteristics of the voltage attenuation structure, including its length, width, overall shape, and doping level, may vary widely to provide a pre-determined voltage attenuation. The voltage attenuation allows the transistor 100 to operate at higher voltages than the underlying FDSOI process normally allows, e.g., from 1.5V to 20V or higher.

Figure 6:
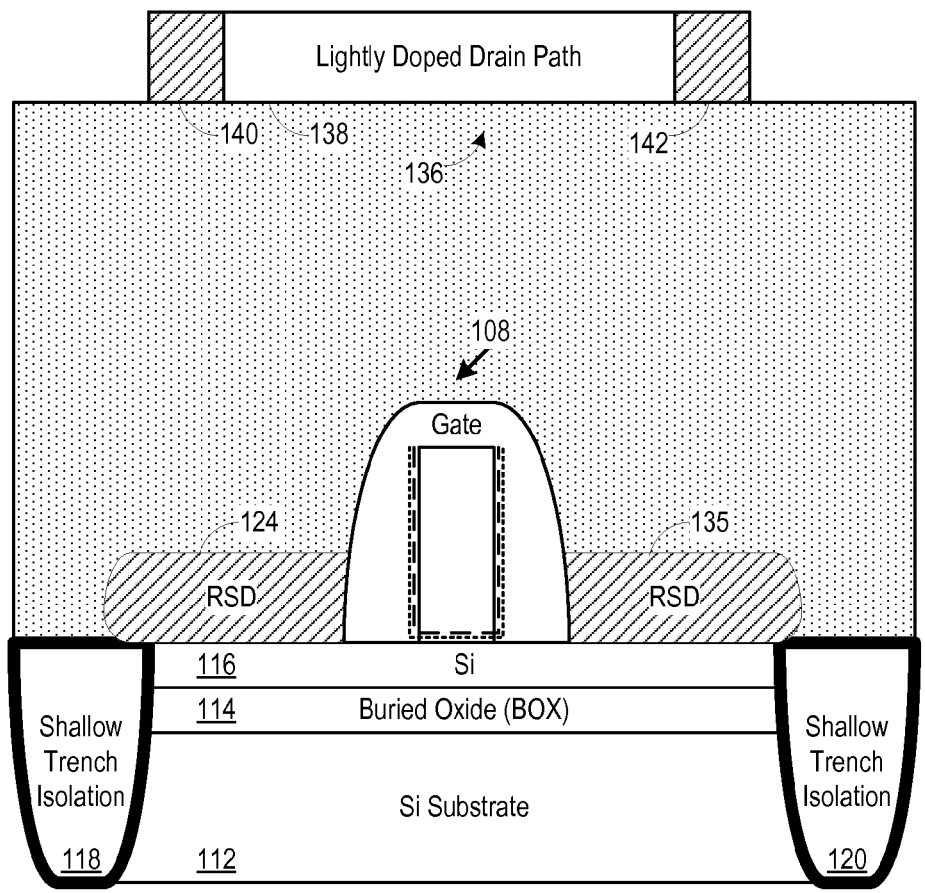
Figure 7:
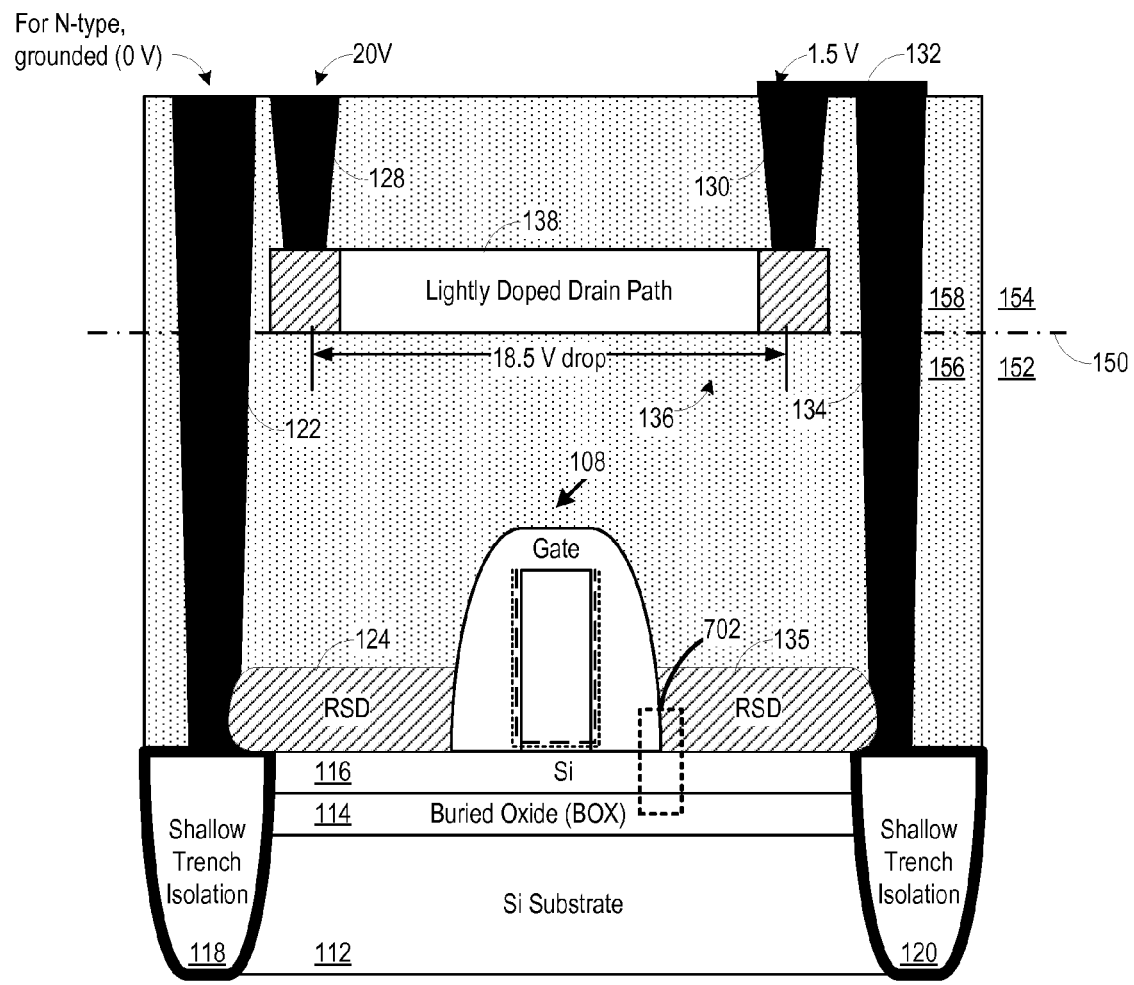

FIG. 6 shows that the process includes fabricating, at the ends of the voltage attenuation structure, add highly doped regions 140 and 142. For N-type doping, the process may use Arsenic or Phosphorous. For P-type doping, the process may use Boron. Mask and implant steps may create the highly doped regions 140 and 142. The highly doped regions 140 and 142 provide contact regions that help to ensure that there are no large voltage drops between those regions and conductive structures in contact with those regions. The fabrication process may also deposit a dielectric oxide layer FIG. 7 shows that the process includes forming connections between the transistor structures. In particular, the fabrication process may etch channels through the oxide layer 158 to the RSD 124, the RSD 135, and to the ends of the voltage attenuation structure. The fabrication process may fill the channels with a conductive material, such as tungsten, and then perform a polishing step. In one implementation, the fabrication process deposits the conductive material using chemical vapor deposition (CVD). This step creates the metallization connections 122, 128, 130, 132, and 134 (as well as connections for the gate structure 108). The metallization connections 130, 132, and 134 emerge and connect at the surface of the second level 154 in this example.

In some embodiments, the resistance of the path 138 is higher than the channel resistance. Accordingly, even when the gate is off (0 V), the voltage at region 702 is less than approximately twice the nominal gate voltage. The three dimensional design facilitates the implementation of these relative resistances. The voltage at region 702 is kept similar to the gate voltage (e.g., 1.5 V to 1.8 V) to increase the break down voltage and prevent gate eruption, while providing overdrive voltage for current. FIG. 7 shows a 20 V drain signal at the drain terminal dropped 18.5 V, via the voltage attenuation structure 136, to approximately 1.5 V. The voltage attenuation structure 136 acts as a high resistance resistor, while providing carriers for conducting current. Note that due to the three dimensional structure with the voltage attenuation structure 136 layered above the first level 152 with the other transistor structure, no additional lateral footprint is needed for an extended drain structure.

Figure 8:
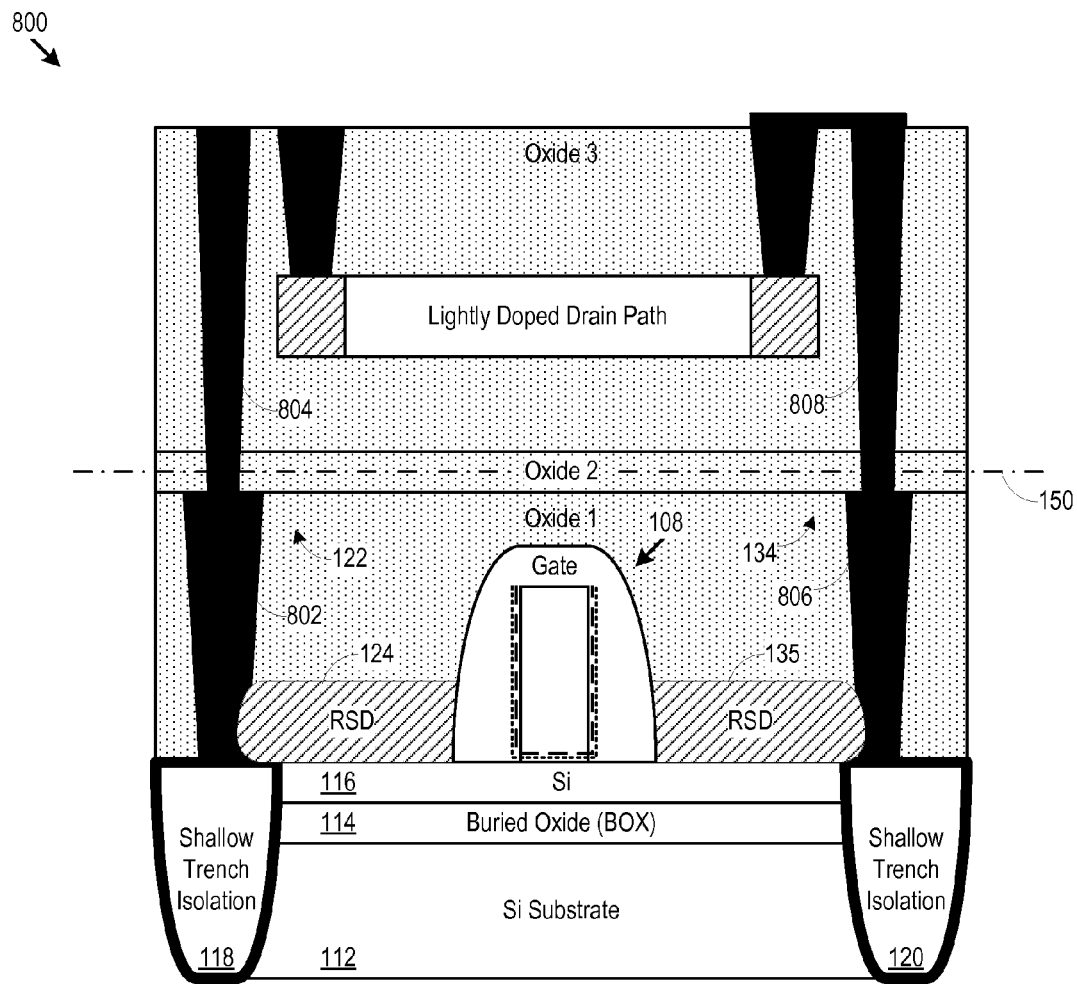
FIG. 8 shows an example of a fabrication sequence for forming metallization contacts for a three dimensional monolithic LDMOS transistor.

FIG. 8 shows an example of a fabrication sequence for forming metallization contacts for a three dimensional monolithic LDMOS transistor 800. FIG. 8 illustrates that the metallization connections 122 and 134 may be formed by a multiple step etch and metal deposition process. In particular, processing of the first level 152 (which includes the oxide layer labeled Oxide 1) may include etching and metallization to form the conductive connections 802 and 806, each of which is a lower part of the overall metallization connections 122 and 134 respectively.

In FIG. 8, oxide 2 represents the molecular bond between the first level 152 and an additional semiconductor layer. Oxide 3 represents the oxide deposited on the additional semiconductor layer. Processing of the second level 154 may include etching and metallization to form the conductive connections 804 and 808, each of which is an upper part of the overall metallization connections 122 and 134 respectively.

Figure 9:
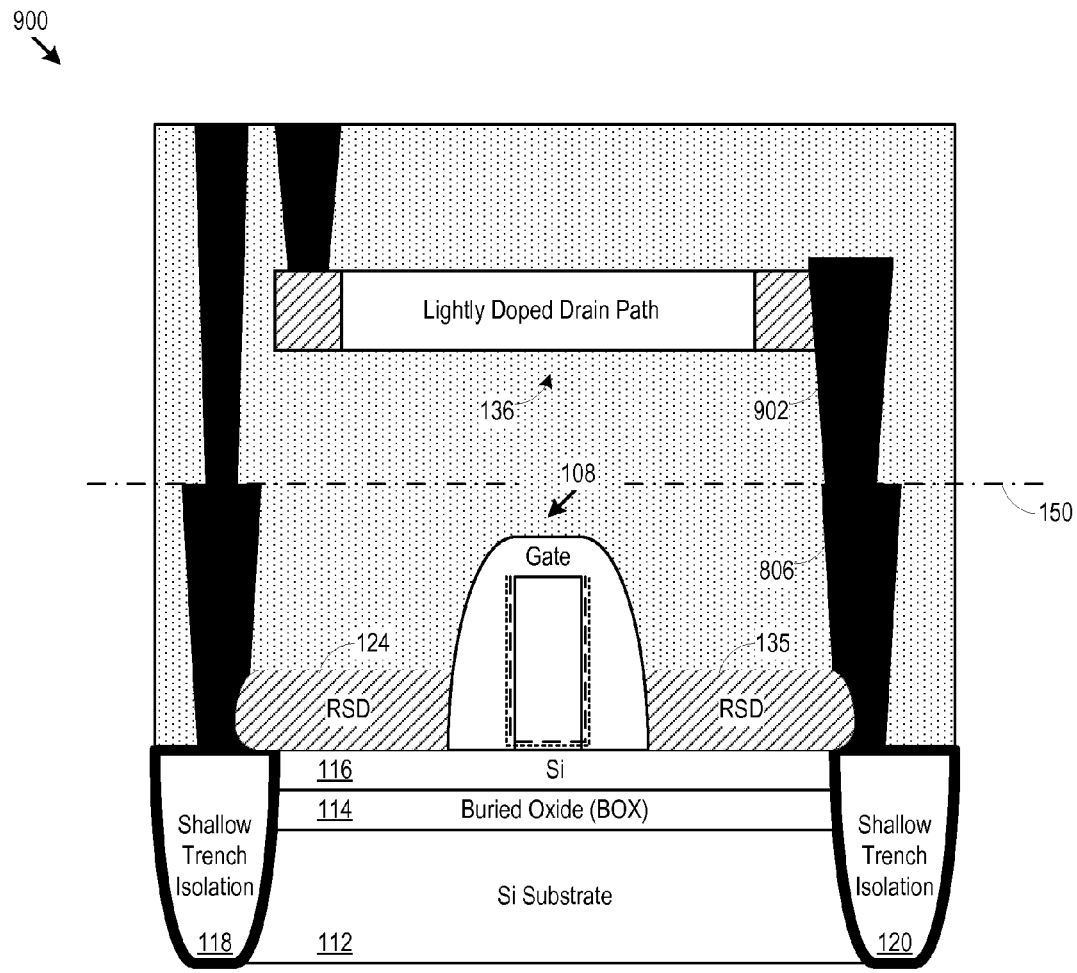
FIG. 9 shows a three dimensional monolithic LDMOS transistor with internal drain connections.

FIG. 9 shows a three dimensional monolithic LDMOS transistor 900 with internal drain connection 902. A fabrication process may create the drain connection 904 using a separate set of mask steps to define, etch, and deposit a conductive material to connect the voltage attenuation structure 136 to the RSD 135. The drain connection 902 does not emerge from the second level of the structure in this example, but is created internally in the overall three dimensional structure.

Figure 10:
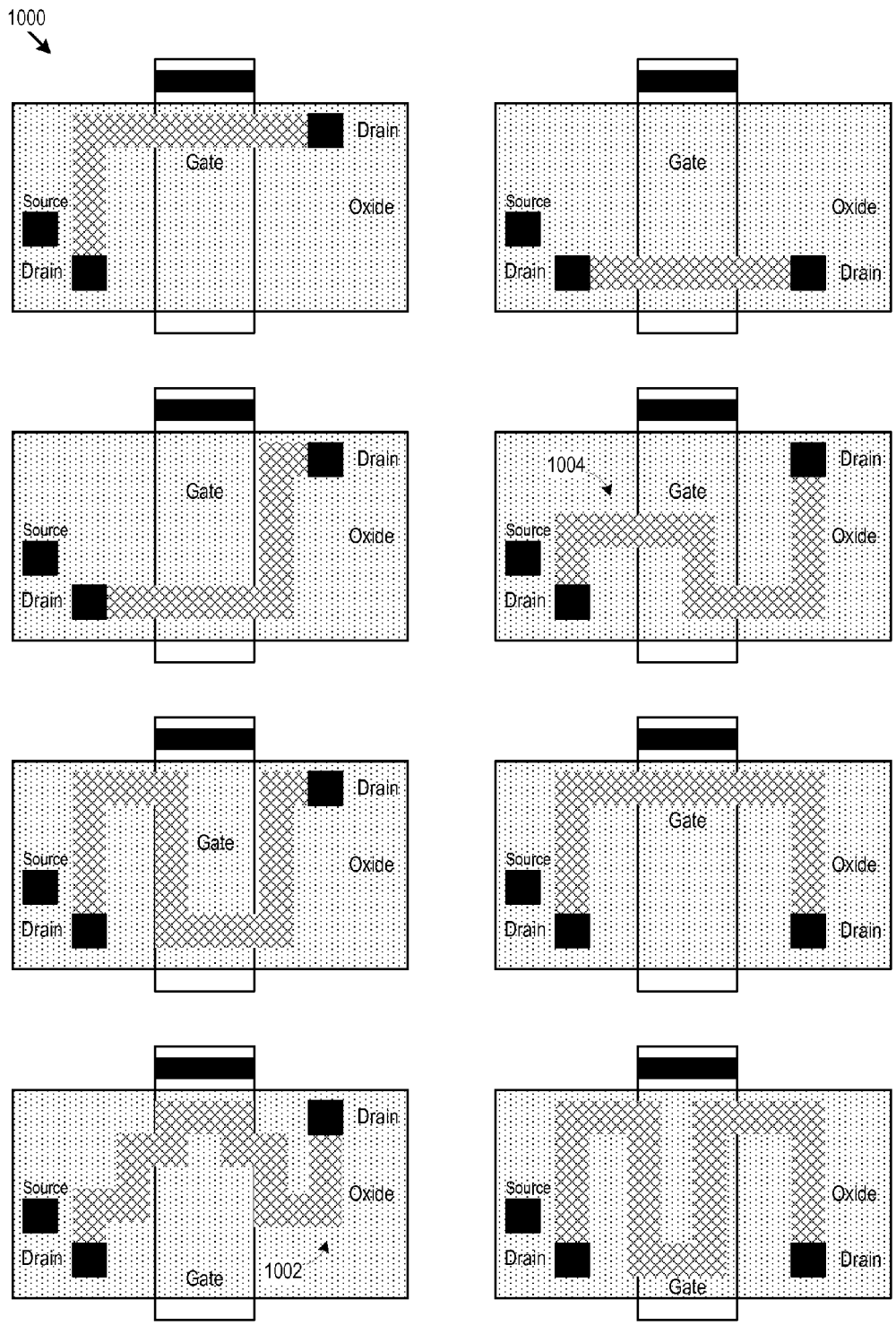
FIG. 10 shows several examples of drain paths.

FIG. 10 shows several examples of drain paths 1000, two of which are labeled drain path 1002 and drain path 1004. Each drain path may include one or more conductive segments having any pre-determined length, width, depth, doping profile or other characteristic. The sequence of segments may be designed to provide a voltage attenuation of any pre-determined amount along the length of the path. The maximum operating voltage of the transistor may be tuned by adjusting the fabricated characteristics of the drain path.

Figure 11:
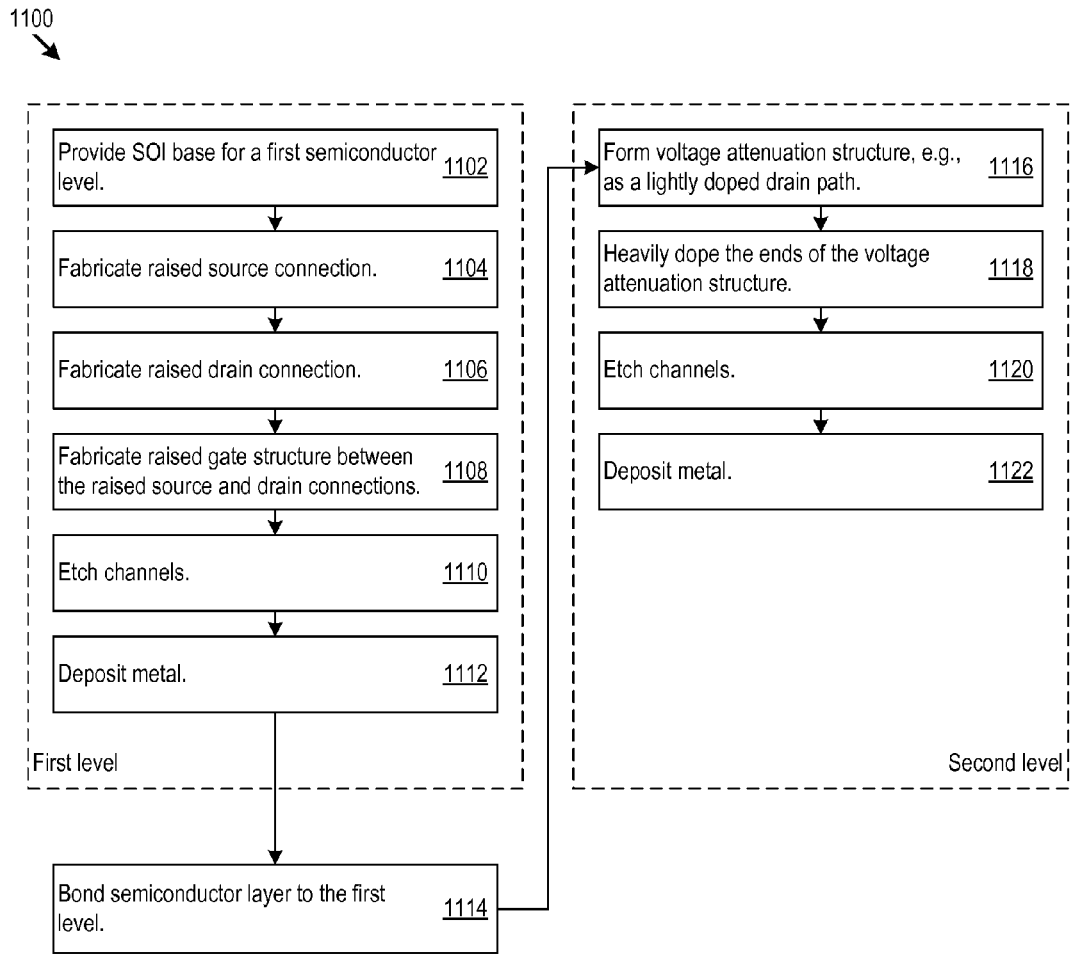
FIG. 11 shows a fabrication process for a three dimensional monolithic LDMOS transistor.

FIG. 11 shows a fabrication process 1100 for a three dimensional monolithic LDMOS transistor. The fabrication process 1100 obtains a SOI base for a first semiconductor level 152 (1102). The fabrication process 1100 fabricates with the first level a raised source connection (1104), a raised drain connection (1106), and a gate structure (1108) positioned between the raised source connection and the raised drain connection. The gate may be of many different types, including FinFET, bulk, FDSOI and other types of gates, whether gate-first or gate-last. As one example, the gate stack may include layers of: silicon oxide, high-k dielectric, polysilicon, then silicide. The fabrication process 1100 also includes etching channels (1110) and depositing metal (1112) to form, e.g., the conductive connections 802 and 806.

The fabrication process 1100 also includes bonding, e.g., by molecular bonding, a second semiconductor layer to the first level (1114). The bonding may occur, e.g., at the planarized SiO2 insulator boundary of the first level. The second semiconductor layer provides a second level 154 for the three dimensional transistor structure.

Within the second level, the fabrication process creates a voltage attenuation structure (1116), e.g., as a lightly doped drain path 138. The voltage attenuation structure is thereby vertically disposed above the first level, e.g., above the gate structure 108. Any drain path may include one or more conductive segments. Each segment may have any pre-determined length, width, depth, doping profile or other characteristic. The sequence of conductive segments may be designed to provide a voltage attenuation of any pre-determined amount along the length of the drain path.

The fabrication process 1100 may heavily dope the ends of the voltage attenuation structure (1118). In some implementations, the doping level is approximately $1\text{-}5\times10^{20}$ atoms per cm$^3$. In addition, the fabrication process 1100 etches channels (1120) and deposits metal (1122) to form, e.g., the conductive connections 804 and 808. The metallization connections form conductive connections between the first end of the voltage attenuation structure and the raised drain connection, and between the second end of the voltage attenuation structure and a drain terminal for the transistor. The metallization connections also form conductive connections between the raised source connection and a source terminal for the transistor.

Various implementations of an LDMOS transistor have been specifically described. However, many other implementations are also possible.

What is claimed is:

1. A transistor comprising:
   a first level comprising:
      a first source/drain structure;
      a second source/drain structure; and
      a gate structure at least partially disposed in a space defined between and separating the source and drain structures;
   a second level vertically above the first level, comprising:
      a voltage attenuation structure electrically isolated from and overlapping at least in part the gate structure, the voltage attenuation structure comprising:
         a continuous partially conductive piece-wise linear path;
         a first end and a second end; and
         multiple segments;
      a first conductive connection between the first end of the voltage attenuation structure and a first terminal for the transistor; and
      a second conductive connection between the second end of the voltage attenuation structure and the second source/drain structure, the second conductive connection extending through the first level and at least part of the second level; and
      a third conductive connection between the first source/drain structure and a second terminal for the transistor, the third conductive connection extending through the first level and the second level;
   wherein the voltage attenuation structure is located entirely between the second conductive connection and the third conductive connection in a cross sectional view and configured to cause a pre-determined voltage drop along the piece-wise linear path.

2. The transistor of claim 1, where:
   the voltage attenuation structure comprises a lightly doped drain segment.

3. The transistor of claim 1, where:
   the first end comprises an N-doped or P-doped section of the voltage attenuation structure.

4. The transistor of claim 1, where:
   the second level comprises a semiconductor layer oxide-to-oxide bonded to the first level.

5. The transistor of claim 1, where:
   the second and third conductive connections are buried within the first level, second level, or both.

6. The transistor of claim 1, where at least one of the multiple segments comprises a lightly doped drain segment.

7. The transistor of claim 1, further comprising:
   a silicon on insulator substrate under the source connection, the drain connection, and the gate structure.

8. The transistor of claim 7, where:
   the silicon on insulator substrate comprises a silicon substrate, a buried oxide layer on the silicon substrate, and a silicon layer on the buried oxide layer.

9. A transistor comprising:
   a substrate that supports a first level of semiconductor structure;
   within the first level:
      a first raised source/drain structure;
      a second raised source/drain structure; and
      a gate structure horizontally aligned with and positioned between the first raised source/drain structure and the second raised source/drain structure; and
      a silicon layer under the gate structure for providing a conductive channel between the first raised source/drain structure and the second raised source/drain structure;
   a substrate that support a second level of semiconductor structure containing a semiconductor layer bonded to the first level at an insulator boundary of the first level;
   within the semiconductor layer:
      a voltage attenuation structure vertically disposed above the first level, the voltage attenuation structure electrically isolated from and overlapping at least in part with the gate structure, the voltage attenuation structure comprising:
         a continuous partially conductive piece-wise linear path;
         a first end and a second end;
         multiple segments;
         wherein the voltage attenuation structure is configured to provide a pre-determined voltage drop along the voltage attenuation structure;
      a first conductive connection between the first end of the voltage attenuation structure and a first terminal for the transistor;

a second conductive connection between the second end of the voltage attenuation structure and the second raised source/drain structure, the second conductive connection extending through the first level and at least part of the semiconductor layer; and a third conductive connection between the first source/drain structure and a second terminal for the transistor, the third conductive connection extending through the first level and the semiconductor layer;

wherein the voltage attenuation structure is located entirely between the second conductive connection and the third conductive connection in a cross sectional view.

10. The transistor of claim 9, wherein the voltage attenuation structure comprises a drain path doped to approximately 10^16 to 10^18 atoms per cm^3.

11. The transistor of claim 9, wherein the first end and the second end comprise N-doped or P-doped portions of the voltage attenuation structure.

12. The transistor of claim 9, wherein the first and second terminals for the transistor are within the second level containing the semiconductor layer.

13. The transistor of claim 12, wherein the first terminal is a drain terminal and the second terminal is a source terminal.

14. The transistor of claim 9, where the first and second ends comprise heavily-doped regions doped to approximately 10^20 to 5^20 atoms per cm^3.

15. A method comprising:
fabricating, in a first level of a semiconductor structure:
  a first source/drain structure;
  a second source/drain structure; and
  a gate structure; and
fabricating, in a second level of the semiconductor structure, the second level vertically disposed above the first level comprising:
  a voltage attenuation structure electrically isolated from and overlapping at least in part with the gate structure, the voltage attenuation structure comprising:
    a continuous partially conductive piece-wise linear path;
    multiple segments;
    wherein the voltage attenuation is configured to provide a pre-determined voltage drop along the voltage attenuation structure; and
  a first conductive connection between a first end of the voltage attenuation structure and a first terminal for the semiconductor structure;
fabricating, in the first and the second levels of the semiconductor structure, a second conductive connection between a second end of the voltage attenuation structure and the second source/drain structure, and a third conductive connection between the first source/drain structure and a second terminal for the semiconductor structure;
wherein the voltage attenuation structure is located entirely between the second conductive connection and the third conductive connection in a cross sectional view.

16. The method of claim 15, where:
the multiple segments comprise a lightly doped drain path relative to the doping level of the first end.

17. The method of claim 15, further comprising fabricating a silicon on insulator substrate under the first source/drain structure, the second source/drain structure, and the gate structure.

18. The method of claim 17, where fabricating the silicon on insulator substrate comprises fabricating:
a silicon substrate;
a buried oxide layer on the silicon substrate; and
a silicon layer on the buried oxide layer.

19. The method of claim 15, where fabricating the gate structure comprises fabricating the gate structure horizontally aligned with and between the source and drain connections.

20. The method of claim 15, where fabricating at the second level comprises fabricating at a lower temperature than that used to fabricate the first level.

* * * * *